(12) United States Patent  (10) Patent No.: US 7,420,499 B2
Sakata et al.  (45) Date of Patent: Sep. 2, 2008

(54) ANALOG-TO-DIGITAL CONVERTER AND THRESHOLD-VALUE CORRECTING METHOD

(75) Inventors: Kohji Sakata, Hashima (JP); Takeshi Otsuka, Hashima (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/645,564

(22) Filed: Dec. 27, 2006

(65) Prior Publication Data

US 2007/0146192 A1 Jun. 28, 2007

(30) Foreign Application Priority Data

Dec. 28, 2005 (JP) ............................. 2005-378537

(51) Int. Cl.
*H03M 1/12* (2006.01)
(52) U.S. Cl. ..................... 341/155; 341/118; 341/154; 341/159
(58) Field of Classification Search ............... 341/118, 341/159
See application file for complete search history.

(56) References Cited

U.S. PATENT DOCUMENTS

| 4,183,016 | A | * | 1/1980 | Sawagata ................. 341/122 |
| 5,450,085 | A | * | 9/1995 | Stewart et al. ............. 341/159 |
| 5,696,508 | A | * | 12/1997 | Gross et al. ............... 341/118 |
| 5,861,829 | A | * | 1/1999 | Sutardja .................. 341/122 |
| 5,936,566 | A | * | 8/1999 | Park ...................... 341/159 |
| 6,107,949 | A | * | 8/2000 | Gross, Jr. ................. 341/159 |
| 6,710,734 | B2 | * | 3/2004 | Ono et al. ................. 341/159 |
| 6,778,124 | B2 | * | 8/2004 | Hashimoto et al. .......... 341/155 |

FOREIGN PATENT DOCUMENTS

JP 8-279752 10/1996

* cited by examiner

*Primary Examiner*—Khai M Nguyen
(74) *Attorney, Agent, or Firm*—McDermott Will & Emery LLP

(57) ABSTRACT

An analog-to-digital converter includes a track-and-hold circuit, a constant-voltage source, a threshold voltage selection circuit, a first comparator to a seventh comparator, an encoder, and a reference voltage output circuit. In a correction mode where the offsets of the first to seventh comparators are to be corrected, a track-and-hold circuit shuts off the input of an analog voltage to the first to seventh comparators by turning off the track-hold switch.

6 Claims, 6 Drawing Sheets

ANALOG-TO-DIGITAL CONVERTER AND THRESHOLD-VALUE CORRECTING METHOD

BACKGROUND OF THE INVENTION

1. Field of the Invention

The present invention generally relates to the analog-to-digital conversion technology (hereinafter referred to as "A-D conversion") and it particularly relates to an analog-to-digital converter (hereinafter referred to as "A-D converter") having a plurality of comparators connected in parallel wherein the comparator compares the level of reference voltage with the level of analog signal.

2. Description of the Related Art

In an A-D converter, a comparator is used to compare the level of reference voltage with the level of analog signal. When the quantization width of an A-D converter, namely the range of voltage expressed by 1 bit is small, the offset of the comparator will become an issue. Reference (1) listed in the following Related Art List discloses a comparator and an offset correcting converter provided with an offset correcting operation separately from an usual A-D conversion operation.

In Reference (1), a switch, by which to input the nominal voltage instead of the analog input to be A-D converted at the time when the offset correction is activated, is provided for the second input of the comparator, for each comparator.

Related Art List (1) Japanese Patent Application Laid-Open No. Hei08-279752.

In a case where the switch is provided for each comparator as in Reference (1), the capacitance and resistance of the switch is added in a path of analog signals. Hence, the frequency characteristics deteriorate and the frequency deterioration may cause the distortion of waveforms, thus eventually impairing the reliability of A-D conversion.

SUMMARY OF THE INVENTION

The present invention has been made in the recognition of the foregoing circumstances and its general purpose is to provide an analog-to-digital converter realizing A-D conversion in which the frequency characteristics are excellent and the wave distortion is unlikely to occur.

In order to solve the above problems, an analog-to-digital (A-D) converter, which converts an analog signal to a digital signal, according to one embodiment of the present invention comprises: a plurality of comparator circuits which compare an input analog voltage with a plurality of different threshold values; a threshold voltage selection circuit which selects voltages inputted to the plurality of comparator circuits, as the plurality of different threshold values; a reference voltage output circuit which outputs a correction reference analog voltage which is to be inputted to the plurality of comparator circuits when the selection of voltage by the threshold voltage circuit is to be corrected; a correction switching circuit which switches between the input and shutoff of the correction reference analog voltage to the plurality of comparator circuits; and a track-and-hold circuit which holds temporarily the input analog voltage and inputs it to the plurality of comparator circuits, wherein when the correction reference analog voltage is inputted to the plurality of comparator circuits, the input of the input analog voltage to the track-and-hold circuit is shut off.

By implementing this embodiment, individually turning on and off the input of the input analog voltage to the plurality of comparator circuits is no longer required. Thus, the frequency characteristics for the input analog voltage improve. Thereby, the waveform distortion of the input analog voltage can be reduced. Also, since the input analog voltage inputted to a plurality of comparators is turned on and off in a unified manner, the input of the input analog voltage to a plurality of comparators is controlled easily and more simply.

During a period of time in which the input analog voltage is temporarily held, the track-and-hold circuit may shut off the input of the input analog voltage to the plurality of comparator circuits all at once. The track-and-hold circuit may deliver the input analog voltage to the plurality of comparators, respectively, without the medium of respective switches.

The A-D converter may further comprise a constant-voltage source which outputs a plurality of constant voltages having different values to be selected in said threshold voltage selection circuit. The threshold voltage selection circuit may include a group of switches that sequentially switch the selection in the ascending or descending order among the plurality of constant voltages for at least one of said plurality of comparator circuits, when the correction reference analog voltage is inputted to the plurality of comparator circuits. In this case, the selection is sequentially switched in the ascending or descending order, so that the selection of a voltage that serves as threshold values in a plurality of comparators can be made easily.

The threshold voltage selection circuit may include shift registers which operate the group of switches so that a voltage is selected, as the threshold value, in the ascending or descending order among the plurality of constant voltages having different values. The use of shift registers made it possible to select the voltage for the group of switches in the ascending or descending order by a simple configuration.

Another embodiment of the present invention relates to a threshold-level correcting method. This method is a method for correcting a threshold value for analog-digital conversion, and the method includes: switching, in a unified manner, a voltage inputted to a plurality of comparator circuits, included in an analog-to-digital converter, from an input analog voltage to be converted, to a correction reference analog voltage by switching a unified switch; inputting the correction reference analog voltage to the plurality of comparator circuits; switching sequentially a threshold voltage to be inputted to each of the plurality of comparator circuits, among a plurality of difference voltages; and fixing the input of a threshold value for at least one of the plurality of comparator circuits when an output of the at least one of the plurality of comparator circuits is inverted.

According to this embodiment, the operation of switching the input to a plurality of comparators from the input analog voltage that is to be converted to the correction reference analog signal is done by switching the unified switch, so that the number of switches can be reduced significantly and the frequency characteristics for the input analog voltage can be improved. As a result, the waveform distortion of input analog voltage to be converted can be reduced.

Arbitrary combinations of the aforementioned constituting elements, and the implementation of the present invention in the form of a method, an apparatus, a system and so forth may also be effective as and encompassed by the embodiments of the present invention.

BRIEF DESCRIPTION OF THE DRAWINGS

Embodiments will now be described by way of examples only, with reference to the accompanying drawings which are meant to be exemplary, not limiting and wherein like elements are numbered alike in several Figures in which.

DETAILED DESCRIPTION OF THE INVENTION

The invention will now be described by reference to the preferred embodiments. This does not intend to limit the scope of the present invention, but to exemplify the invention.

First Embodiment

A first embodiment of the present invention relates to an A-D converter which converts an analog signal into a 3-bit digital signal.

Figure 1:
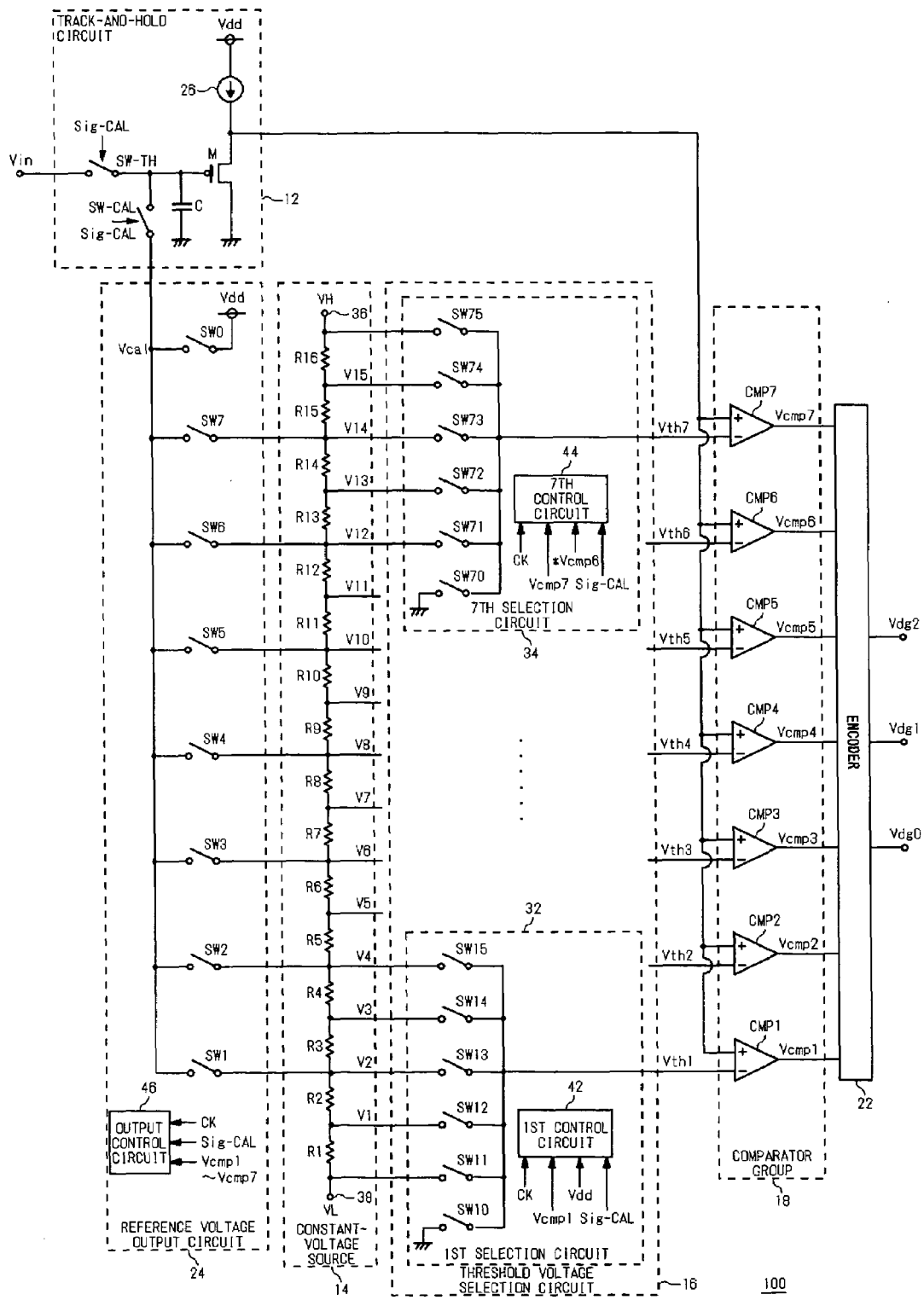
FIG. 1 illustrates a structure of an A-D converter according to a first embodiment of the present invention.

FIG. 1 illustrates a structure of an A-D converter 100 according to the first embodiment.

The A-D converter 100 is comprised of a track-and-hold circuit 12, a constant-voltage source 14, a threshold voltage selection circuit 16, a group of comparators 18, an encoder 22 and a reference voltage output circuit 24. The A-D converter 100 has two modes of operation. One is a conversion mode in which A-D conversion is performed and the other is a correction mode in which the offsets of comparators are corrected.

The group of comparators 18 include a first comparator CMP1 to a seventh comparator CMP7. Noninverting input terminals of the first comparator CMP1 through the seventh comparator CMP7 are connected with the output terminal of the track-and-hold circuit 12. The inverting input terminals of the first comparator CMP1 through the seventh comparator CMP7 are respectively connected to the output terminals of the threshold voltage selection circuit 16. The output terminals of the first comparator CMP1 through the seventh comparator CMP7 are connected to the encoder 22. Voltages at the outputs of the first comparator CMP1 to the seventh comparator CMP7 are denoted by a first comparison output Vcmp1 to a seventh comparison output Vcmp7, respectively.

The track-and-hold circuit 12 includes a track-hold switch SW-TH, a correction switch SW-CAL, a capacitor C, a transistor M, and a constant-current source 26. The transistor M is a p-channel MOSFET (Metal Oxide Semiconductor Field Effect Transistor).

The track-hold switch SW-TH is provided on a path where an analog voltage Vin is inputted. When a correction mode signal Sig-CAL is high level, the track-hold switch SW-TH is turned off. On the other hand, when the correction mode signal Sig-CAL is low level, the track-hold switch SW-TH is turned on and off periodically by a track-hold control signal which is not shown in FIG. 1.

The correction switch SW-CAL is provided on a path leading to an output of the reference voltage output circuit 24. When a correction mode signal Sig-CAL is high level, the correction switch SW-CAL is turned on. On the other hand, when the correction mode signal Sig-CAL is low level, the correction switch SW-CAL is turned off.

The track-hold switch SW-TH and the correction switch SW-CAL are connected with a gate terminal of the transistor M wherein the gate serves as a control terminal thereof. The capacitor C is provided between the gate terminal of the transistor M and the ground. The constant-current source 26 and the transistor M are connected in series between the power line Vdd and ground, which constitutes a configuration of a source follower. The voltage at a source terminal of the transistor M will become an output of the track-and-hold circuit 12.

The constant-voltage source 14 includes a first resistor R1 to a sixteenth resistor R16 connected in series between a high voltage terminal 36 and a low voltage terminal 38. The values of resistance of the first resistor R1 to the sixteenth resistor R16 may each be the same value. A voltage VH at the high voltage terminal 36, a voltage VL at the low voltage terminal 38 and voltages V1 to V15 divided by the first resistor R1 through the sixteenth resistor R16 serve as the outputs of the constant-voltage source 14.

The threshold voltage selection circuit 16 includes a first selection circuit 32 to a seventh selection circuit 34. Note that a second selection circuit to a sixth selection circuit are omitted in FIG. 1. The first selection circuit 32 to the seventh selection circuit 34 are associated respectively with the first comparator CMP1 to the seventh comparator CMP7.

The first selection circuit 32 includes switches SW10 to SW15 and a first control circuit 42. One ends of the switches SW10 to SW15 are connected to an inverting input terminal of the first comparator CMP1. The other ends of the switches SW10 to SW15 are connected to the ground, the low voltage terminal 38, a connection point of the first resistor R1 and the second resistor R2, a connection point of the second resistor R2 and the third resistor R3, a connection point of the third resistor R3 and the fourth resistor R4 and a connection point of the fourth resistor R4 and the fifth resistor R5, respectively.

The first control circuit 42 turns on any of the switches SW10 to SW15 and turns off the rest. Through a switch that has been turned on, a first threshold voltage Vth1 is provided to the inverting input terminal of the first comparator CMP1. That is, the first control circuit 42 supplies any of the ground potential, the voltage VL and voltages V1 to V4, as the first threshold voltage Vth1, to the inverting input terminal of the first comparator CMP1. When the correction mode signal Sig-CAL is low level, the first control circuit 42 fixes the selection of a switch to be turned on. A detailed description of a structure and operation on the first control circuit 42 will be given later.

The seventh selection circuit 34 includes switches SW70 to SW75 and a seventh control circuit 44. One ends of the switches SW70 to SW75 are connected to an inverting input terminal of the seventh comparator CMP7. The other ends of the switches SW70 to SW75 are connected to the ground, a connection point of the twelfth resistor R12 and the thirteenth resistor R13, a connection point of the thirteenth resistor R13 and the fourteenth resistor R14, a connection point of the fourteenth resistor R14 and the fifteenth resistor R15, a connection point of the fifteenth resistor R15 and the sixteenth resistor R16, and the high voltage terminal 36, respectively.

The seventh control circuit 44 turns on any of the switches SW70 to SW75 and turns off the rest. Through a switch that has been turned on, a seventh threshold voltage Vth7 is provided to the inverting input terminal of the seventh comparator CMP7. That is, the seventh control circuit 44 supplies any of the ground potential, voltages V12 to V15 and the voltage VH, as the seventh threshold voltage Vth7, to the inverting input terminal of the seventh comparator CMP7. When the correction mode signal Sig-CAL is low level, the seventh control circuit 44 fixes the selection of a switch to be turned on.

The second selection circuit to the sixth selection circuit are configured the same way as with the first selection circuit 32 and the seventh selection circuit 34. The second selection circuit supplies any of the ground potential and the voltages V2 to V6, as a second threshold voltage Vth2, to the inverting input terminal of the second comparator CMP2. The third selection circuit supplies any of the ground potential and the voltages V4 to V8, as a third threshold voltage Vth3, to the inverting input terminal of the third comparator CMP3. The fourth selection circuit supplies any of the ground potential and the voltages V6 to V10, as a fourth threshold voltage Vth4, to the inverting input terminal of the fourth comparator CMP4. The fifth selection circuit supplies any of the ground potential and the voltages V8 to V12, as a fifth threshold voltage Vth5, to the inverting input terminal of the fifth comparator CMP5. The sixth selection circuit supplies any of the ground potential and the voltages V10 to V14, as a sixth threshold voltage Vth6, to the inverting input terminal of the sixth comparator CMP6.

The reference voltage output circuit 24 includes switches SW0 to SW7 and an output control circuit 46. One ends of the switches SW0 to SW7 are connected with the correction switch SW-CAL. The other ends of the switches SW0 to SW7 are connected to the power line Vdd, a connection point of the second resistor R2 and the third resistor R3, a connection point of the fourth resistor R4 and the fifth resistor R5, a connection point of the sixth resistor R6 and the seventh resistor R7, a connection point of the eighth resistor R8 and the ninth resistor R9, a connection point of the tenth resistor R10 and the eleventh resistor R11, a connection point of the twelfth resistor R12 and the thirteenth resistor R13, and a connection point of the fourteenth resistor R14 and the fifteenth resistor R15, respectively.

The output control circuit 46 turns on any of the switches SW0 to SW7 and turns off the rest. Through a switch that has been turned on and the track-and-hold circuit 12, a reference voltage Vcal for use in correction is inputted to the noninverting inputs of the first comparator CMP1 to the seventh comparator CMP7. That is, the reference voltage output circuit 24 outputs any of voltages V2, V4, V6, V8, V10, V12, V14 and the voltage of supply line Vdd, as a correction reference voltage Vcal. Here, the voltages V2, V4, V6, V8, V10, V12 and V14 are each equivalent to the voltage at a quantization level when the analog voltage Vin is converted into a 3-bit digital signal. The detailed structure and operation of the output control circuit 46 will be given later.

A description will now be given of an operation of the A-D converter 100 shown in FIG. 1. The A-D converter 100 has two operation modes wherein one is a conversion mode for performing A-D conversion and the other is a correction mode for correcting the offsets of comparators.

The conversion mode will first be described.

In the conversion mode, a correction mode signal Sig-CAL is low level. Thereby, the correction switch SW-CAL is turned off. Also, the track-hold switch SW-CAL is in a state such that it is turned on and off periodically by a not-shown track-hold control signal. The on-off state of each switch included in the first selection circuit 32 to the seventh selection circuit 34 stays fixed during a period in which Sig-CAL is low level. The on-off state of each switch is set by a correction mode executed before the current conversion mode.

The capacitor C is charged or discharged during a period in which the track-hold switch SW-TH is on. After the track-hold switch SW-TH is turned off, it holds the analog voltage Vin during said period. The analog voltage Vin thus held is outputted to the noninverting input terminals of the first comparator CMP1 to the seventh comparator CMP7 via a source follower circuit which is so configured as to include therein the constant-current source 26 and the transistor M. That is, the track-and-hold circuit 12 temporarily holds the inputted analog voltage Vin and supplies the analog voltage Vin thus held to the noninverting input terminals of the first comparator CMP1 to the seventh comparator CMP7.

The constant-voltage source 14 outputs, as the constant voltage, the voltage VH at the high voltage terminal 36, the voltage VL at the low voltage terminal 38 and the voltages V1 to V15 divided by the first resistor R1 to the sixteenth resistor R16, to the threshold voltage selection circuit 16. The first selection circuit 32 to the seventh selection circuit 34 in the threshold voltage selection circuit 16 output the first threshold voltage Vth1 to the seventh threshold voltage Vth7 selected from among the outputs of the constant-voltage source 14, to the inverting input terminals of the first comparator CMP1 to the seventh comparator CMP7. The first threshold voltage Vth1 to the seventh threshold voltage Vth7 in the conversion mode are set by the correction mode executed prior to this conversion mode. In other words, the first threshold voltage Vth1 to the seventh threshold voltage Vth7 are corrected in the light of the offsets in the first comparator CMP1 to the seventh comparator CMP7.

The first comparator CMP1 to the seventh comparator CMP7 compare the analog voltage Vin inputted from the track-and-hold circuit 12, with each of the first threshold voltage Vth1 to the seventh threshold voltage Vth7 inputted from the threshold voltage selection circuit 16. If the analog voltage Vin is greater than the first threshold voltage Vth1, the first comparator CMP1 will output a high-level first comparison output Vcmp1 to the encoder 22. If, on the other hand, the analog voltage Vin is less than the first threshold voltage Vth1, the first comparator CMP1 will output a low-level first comparison output Vcmp1 to the encoder 22. In the similar manner, the second comparator CMP2 to the seventh comparator CMP7 output a second comparison output Vcmp2 to a seventh comparison output Vcmp7 to the encoder 22.

Based on the first comparison output Vcmp1 to the seventh comparison output Vcmp7, the encoder 22 output codes Vdg0 to Vdg2 represented by "0's" and "1's". The codes Vdg0 to Vdg2 are composed of 3-bit digital values.

Next, a description will be given of the correction mode.

The correction mode is started when the correction mode signal Sig-CAL changes from a low level to a high level. As the correction mode signal Sig-CAL becomes high level, the track-hold switch SW-TH is turned off, thereby shutting off the input of the analog voltage Vin.

On the other hand, as the correction mode signal Sig-CAL goes high, the correction switch SW-CAL, the switch SW0 of the reference voltage output circuit 24, the switch SW10 of the first selection circuit and the switch SW70 of the seventh selection circuit 34 are all turned on. The switches in the second selection circuit to the sixth selection circuit corresponding to the switch SW10 are also turned on. Thereby, the voltage of the power supply line Vdd is inputted to the noninverting input terminals of the first comparator CMP1 to the seventh comparator CMP7. The ground potential is inputted to the inverting input terminals of the first comparator CMP1 to the seventh comparator CMP7. Accordingly, the outputs of the first comparator CMP1 to the seventh comparator CMP7 are reset to the high level.

After the outputs of the first comparator CMP1 to the seventh comparator CMP7 have been reset to the high level, the offsets are corrected in the order of the first comparator CMP1, the second comparator CMP2, ... and the seventh comparator CMP7.

When correcting the offset of the first comparator CMP1, the reference voltage output circuit 24 turns on the switch SW1 and turns off the rest of the switches. When the offset of the second comparator CMP2 is to be corrected, the switch SW2 is turned on and the rest of the switches are turned off. When the offsets of the third comparator CMP3 to the seventh comparator CMP7 are to be corrected, the on and off of the switches is controlled the same way. The on and off of these switches are controlled by the output control circuit 46. A detail description of an operation to correct the offsets will be given later.

When the offset of the seventh comparator output Vcmp7 has been corrected, namely when the offsets of all the comparators have been corrected, the correction mode ends. That is, the correction mode signal Sig-CAL transits from a high level to a low level. When the correction mode signal Sig-CAL returns to the low level, the state of the A-D converter 100 returns to the above-described conversion mode.

Figure 2:
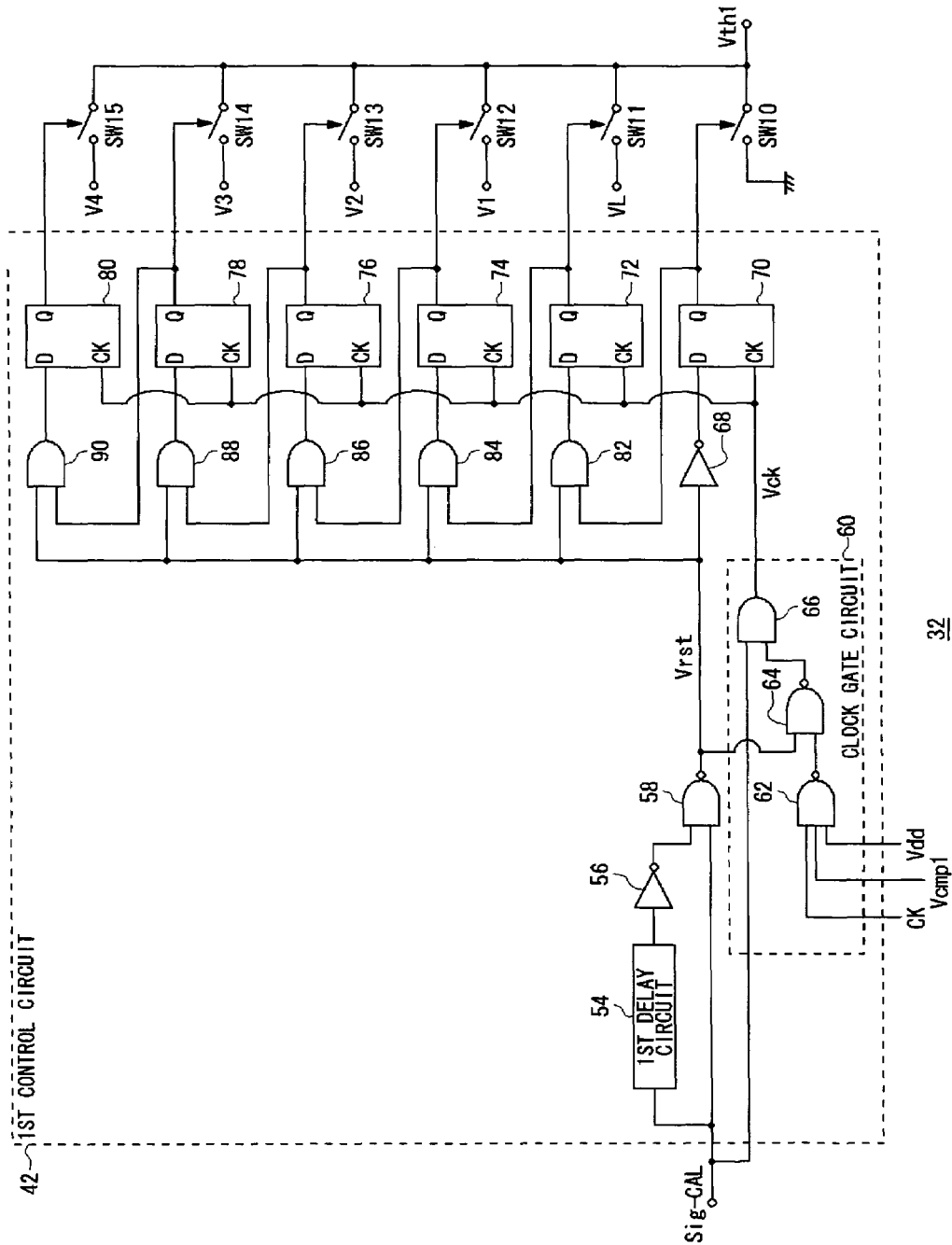
FIG. 2 illustrates a structure of a first selection circuit shown in FIG. 1.

FIG. 2 illustrates a structure of the first selection circuit 32 as shown in FIG. 1. In FIG. 2, components identical to or equivalent to those of FIG. 1 are given the same reference numerals and the explanation thereof are omitted where appropriate.

A first control circuit 42 included in the first selection circuit 32 includes a first delay circuit 54, a second inverter 56, a first NAND gate 58, a clock gate circuit 60, a first inverter 68, a first D-FF 70 to a sixth D-FF 80, a second AND gate 82 to a sixth AND gate 90. The clock gate circuit 60 includes a second NAND gate 62, a third NAND gate 64 and a first AND gate 66.

The first delay circuit 54 and the second inverter 56 are connected in series between the input terminal of the correction mode signal Sign-CAL and one end of the NAND gate 58. The correction mode signal Sig-CAL is inputted to the other end of the first NAND gate 58. The output of the first NAND gate 58 is connected with the first D-FF 70 via the first inverter 68. The output terminal of the first NAND gate 58 is also connected with the second D-FF 72 to the sixth D-FF 80 via one ends of the second AND gate 82 to the sixth AND gate 90, respectively. The other ends of the second AND gate 82 to the sixth AND gate 90 are connected to the output terminals of the first D-FF 70 to the fifth D-FF 78, respectively. The output terminals of the first D-FF 70 to the sixth D-FF 80 are connected to switches SW10 to SW15, respectively.

The NAND gate 62 receives the input of a clock CK, a first comparison output Vcmp1 and a voltage of power supply line Vdd. The output terminal of the second NAND gate 62 is connected to one input terminal of the third NAND gate 64. The output terminal of the first NAND gate 58 is connected to the other input terminal of the third NAND gate 64. The output terminal of the third NAND gate 64 is connected to one input terminal of the first AND gate 66. The input terminal of the correction mode signal Sig-CAL is connected to the other input terminal of the AND gate 66. The output terminal of the first AND gate 66 is connected to clock terminals of the first D-FF 70 to the sixth D-FF 80.

Figure 3:
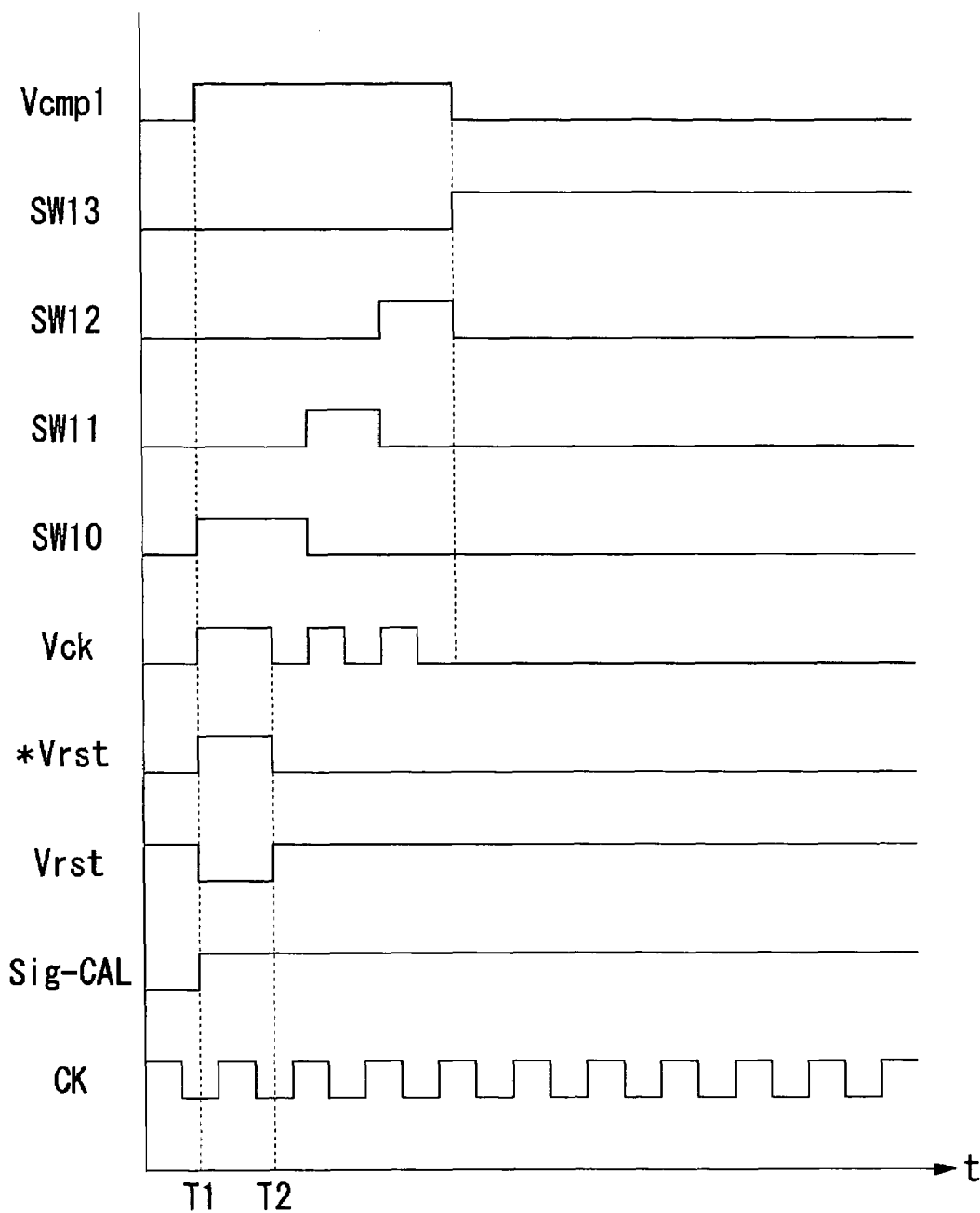
FIG. 3 is a timing chart showing an operation of a first control circuit shown in FIG. 2, namely an operation of correcting the offset of a first comparator.

FIG. 3 is a timing chart showing an operation of the first control unit 42 as shown in FIG. 2, namely an operation of correcting the offset of the first comparator CMP1. In the timing chart of FIG. 3, the states of signals shown in order from the bottom to the top are a clock CK, a correction mode signal Sig-CAL, a reset voltage Vrst, an inverted reset voltage *Vrst, an input clock Vck, switches SW10, SW11, SW12, SW13, and a first comparison output Vcmp1. It is assumed in FIG. 3 that the switch is turned on in response to a high-level state. The voltage V2 which is normally a threshold value in the first comparator CMP1 is inputted to the noninverting input terminal of the first comparator CMP1. Also, it is assumed herein that the initial state of the first comparison output Vcmp1 is a low level.

At time T1, the correction mode signal Sig-CAL transits from a low level to a high level. Then, as a result of operation by the first delay circuit 54, the second inverter 56 and the first NAND gate 58, the reset voltage Vrst shows a pulse signal of a low level during a period from time T1 until T2. That is, at time T1 the reset voltage Vrst transits from a high level to a low level, and at time T2 it transits from a low level to a high level. The pulse width of the reset voltage and the period from time T1 until time T2 are determined by the delay time set by the first delay circuit 54.

When at time T1 the reset voltage Vrst transits from the high level to a low level, the input to the first D-FF 70 transits from a low level to a high level because of an inversion operation of the first inverter 68. The input to the first D-FF 70 is indicated in FIG. 3 by the inverted reset voltage *Vrst. When the reset voltage Vrst transits from a high level to a low level, the input clock Vck transits from a low level to a high level as a result of the operation performed by the third NAND gate 64 and the first AND gate 66. That is, the clock input of the first D-FF 70 transits from a low level to a high level. With this rising edge, the input to the first D-FF 70, which has transited from a low level to a high level, is conveyed to the output thereof. That is, the output of the first D-FF 70 transits from the low level to the high level. Thereby, the switch SW10 is turned on.

When the switch SW10 is turned on, the ground potential is inputted to the inverting terminal of the first comparator CMP1 in FIG. 1. Thus, the first comparison output Vcmp1 which is an output of the first comparator CMP1 is reset to a high level. Every time the clock rises up after the switch SW10 has been turned on, the output of the first D-FF 70 which transits to a high level is shifted to the output of the second D-FF 72 and the output of the third D-FF 74.

In the timing chart of FIG. 3, when the output of the first D-FF 70 is shifted to the output of the fourth D-FF 76, namely when the switch SW13 is turned on, the first comparison output Vcmp1 transits from a high level to a low level. When the first comparison output Vcmp1 goes low, the clock CK is shut off by an operation of the clock gate circuit 60. That is, when the first comparison output Vcmp1 goes low, the input clock Vck is fixed to a low level. Thus, a state is maintained where the output of the fourth D-FF 76 is high level and accordingly the switch SW13 is fixed to an ON state. This completes the correction of offset in the first comparator CMP1. Note that when the output of the first comparison output Vcmp1 transits from a high level to a low level, the correction of offset in the second comparator CMP2 is started.

The second selection circuit to the sixth selection circuit as well as the seventh circuit 34 may be configured the same way as shown in FIG. 2. The offsets of the second comparator CMP2 to the seventh comparator CMP7 are corrected by the same operation as in the timing chart shown in FIG. 3. In the second selection circuit to the sixth selection circuit and the seventh selection circuit 34, the input corresponding to the input to the second NAND gate 62 of FIG. 2 differs from that of the first selection circuit. That is, in the case of the first selection circuit 32, the inputs to the second NAND gate 62 of the first control circuit 42 are the clock CK, the first comparison output Vcmp1 and the voltage of the power line Vdd. In contrast thereto, in the case of the second selection circuit to the sixth selection circuit and the seventh selection circuit 34, the input of a NAND gate corresponding to the second NAND gate 62 is the voltage, in which the output of a comparator immediately before a comparator to be calibrated is inverted, instead of the voltage of the power line Vdd. When the correction of the seventh comparator CMP7 is completed, namely when the seventh comparator output Vcmp7 transits from a high level to a low level, the correction mode signal Sig-CAL also transits from a high level to a low level and then the correction mode terminates.

Figure 4:
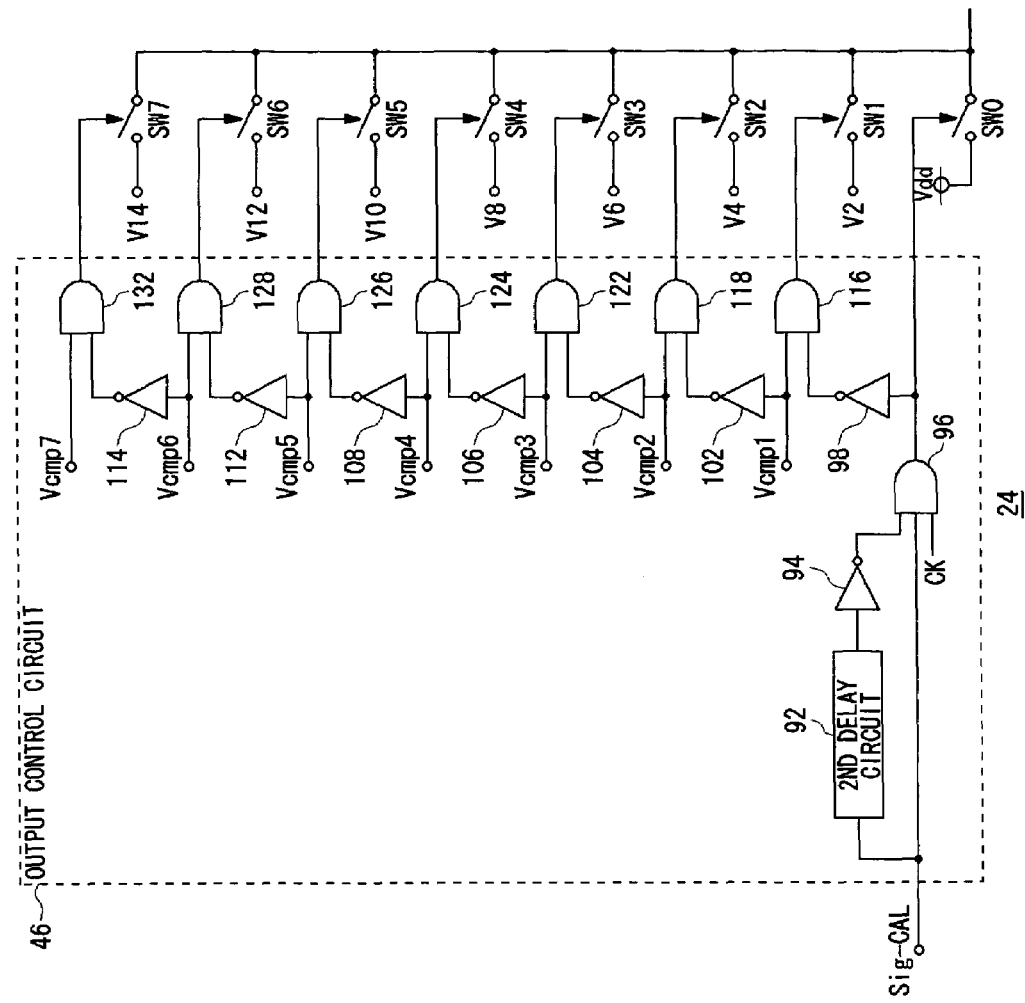
FIG. 4 illustrates a structure of a reference voltage output circuit shown in FIG. 1.

FIG. 4 illustrates a structure of the reference voltage output circuit 24 as shown in FIG. 1. In FIG. 4, components identical to or equivalent to those of FIG. 1 are given the same reference numerals and the explanation thereof are omitted where appropriate.

An output control circuit 46 included in the reference voltage output circuit 24 includes a second delay circuit 92, a third inverter 94, a seventh AND gate 96, a fourth inverter 98 to a tenth inverter 114, and an eighth AND gate 116 to a fourteenth AND gate 132.

The second delay circuit 92 and the third inverter 94 are connected in series between an input terminal of correction mode signal Sig-CAL and a first input terminal of the seventh AND gate 96. The clock CK and the correction mode signal Sig-CAL are inputted to a second input terminal and a third input terminal of the seventh AND gate 96, respectively. The output of the seventh AND gate 96 is supplied to a switch SW0. The output terminal of the seventh AND gate 96 is also connected to one input terminal of the eighth AND gate 116 via the fourth inverter 98. The first comparison output Vcmp1 is inputted to the other input terminal of the eighth AND gate 116. The output of the eighth AND gate 116 is supplied to a switch SW1.

The first comparison output Vcmp1 is supplied to one input terminal of the ninth AND gate 118 via the fifth inverter 102. The second comparison output Vcmp2 is inputted to the other input terminal of the ninth AND gate 118. That is, the ninth AND gate 118 receives the input of the inverted first comparison output Vcmp1 and the second comparison output Vcmp2. The output of the ninth AND gate 118 is delivered to a switch SW2. Similarly, the tenth AND gate 122 receives the inverted second comparison output Vcmp2 and the third comparison output Vcmp3 as the input, and the output thereof is delivered to a switch SW3. The same holds for the eleventh AND gate 124 to the fourteenth AND gate 132 and therefore the description thereof is omitted here.

Figure 5:
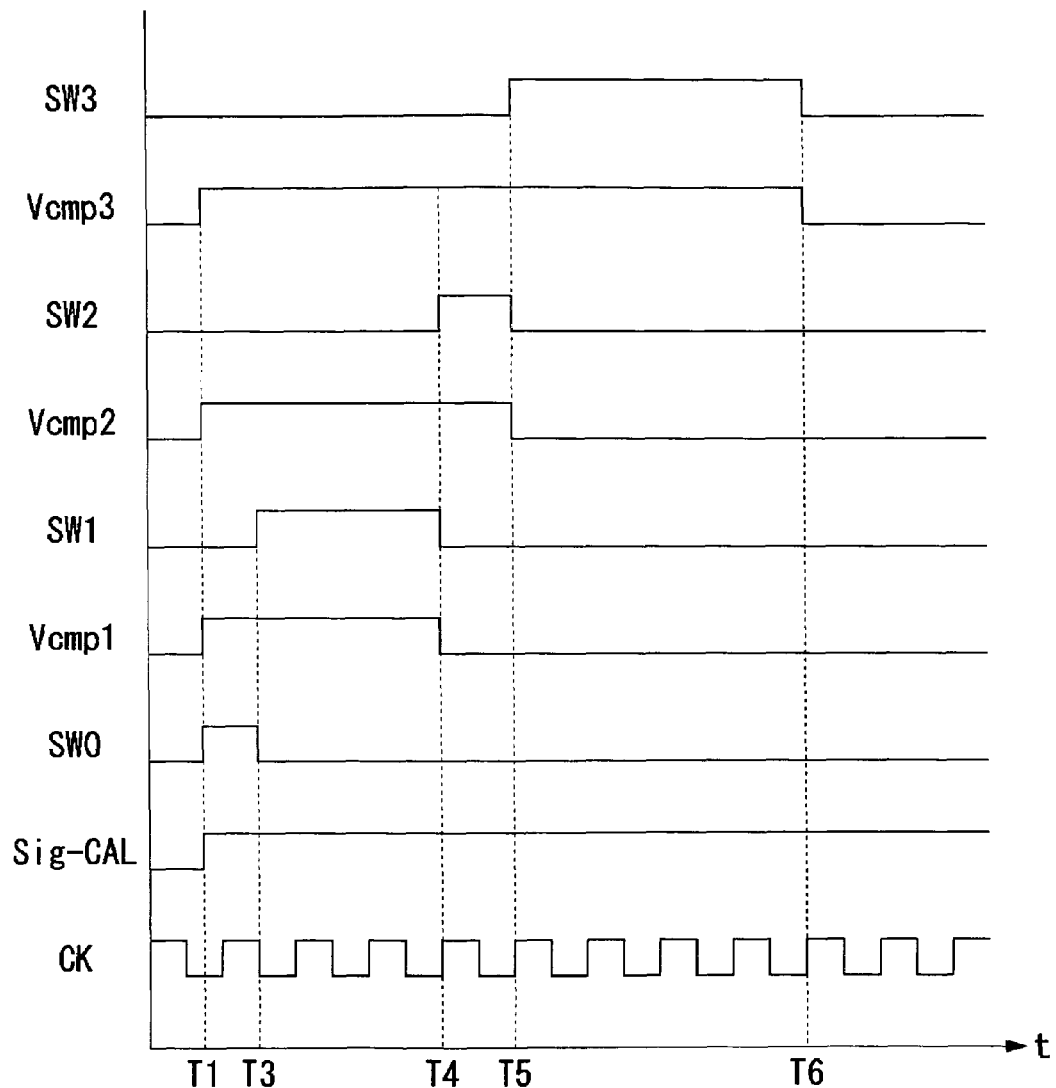
FIG. 5 is a timing chart showing an operation of an output control circuit shown in FIG. 4.

FIG. 5 is a timing chart showing an operation of the output control circuit 46 as shown in FIG. 4. In the timing chart of FIG. 5, the states shown in order from the bottom to the top are a clock CK, a correction mode signal Sig-CAL, a switch SW0, a first comparison output Vcmp1, a switch SW1, a second comparison output Vcmp2, a switch SW2, a third comparison output Vcmp3, and a switch SW3. Note that the states of a fourth comparison output Vcmp4 to a seventh comparison output Vcmp7 and switches SW4 to SW7 are omitted in FIG. 5.

At time T1, the correction mode signal Sig-CAL transits from a low level to a high level. At this time, a pulse which stays high level during the period from time T1 until time T3 is inputted to the switch SW0 as a result of the operation of the second delay circuit 92, the third inverter 94 and the seventh AND gate 96. This period is determined by the delay time set by the second delay circuit 92 or the clock CK. The switch SW0 receives the input of a pulse that stays high level during the period from time T1 until time T3, and the switch SW0 is being turned on during that period. Thereby, the voltage of the supply line Vdd is inputted to the noninverting input terminals of the first comparator CMP1 to the seventh comparator CMP7. As a result, the first comparison output Vcmp1 to the seventh comparison output Vcmp7 which are the outputs of the first comparator CMP1 to the seventh comparator CMP7, respectively, are reset to the high level.

As described above, if the correction mode signal Sig-CAL transits to a high level, the ground potential will be inputted to the inverting input terminals of the first comparator CMP1 to the seventh comparator CMP7. Thereby, the first comparison output Vcmp1 to the seventh comparison output Vcmp7 are reset to the high level. Accordingly, if the correction mode signal Sig-CAL transits to a high level, the voltage of power supply line Vdd will be inputted to the noninverting input terminals of the first comparator CMP1 to the seventh comparator CMP7 and the ground potential will be inputted to the inverting terminals thereof before a correction operation starts. Thereby, the first comparison output Vcmp1 to the seventh comparison output Vcmp7 are reset reliably.

The transition of a high level to a low level in the clock CK at time T3 turns off the switch SW0. Upon the turning off of this switch SW0, the output of the eighth AND gate 116 transits to a high level and the switch SW1 is turned on. At time T4, the correction of the first comparator CMP1 is terminated and the first comparison output Vcmp1 transits from a high level to a low level. As the first comparison output Vcmp1 transits to the low level, the output of the eighth AND gate 116 transits from a high level to a low level and the switch SW1 is turned off. Also, as the first comparison output Vcmp1 transits to the low level, the output of the ninth AND gate 118 transits from a low level to a high level and the switch SW2 is turned on. At time T5, the correction of offset of the second comparator CMP2 is terminated and the second comparison output Vcmp2 transits from a high level to a low level. As the second comparison Vcmp2 transits to a low level, the output of the ninth AND gate 118 transits from the high level to a low level and the switch SW2 is turned off. As the second comparison output Vcmp2 transits to a low level, the output of the tenth AND gate 122 transits from a low level to a high level and the switch SW3 is turned on. At time T6, the correction of offset of the third comparator CMP3 is terminated and the third comparison output Vcmp3 transits from a high level to a low level. As the third comparison output Vcmp3 transits to the low level, the output of the tenth AND gate 122 transits from the high level to a low level and the switch SW3 is turned off. Thereafter, the switches SW4 to SW7 are sequentially turned on and off in the similar manner.

Exemplary operations and advantageous effects of the first embodiment will now be described.

In the correction mode, the A-D converter 100 shuts off the input of the analog voltage Vin by the track-and-hold switch SW-TH. Thereby, if the output of the reference voltage output circuit 24, instead of the analog voltage Vin, is to be supplied to the group of comparators 18, there will be no need of providing another switch to shut off the analog voltage Vin. Hence, the increase in circuit scale of the A-D converter 100 can be suppressed.

Also, the problems or disadvantageous aspects which can be expected as a result of the provision of the another switch besides the track-and-hold switch SW-TH can be relieved. That is, the deterioration of frequency characteristics caused by the load resistance and load capacity of such another switch or switches can be reduced. Thus the distortion of the waveforms of the analog voltage Vin can be suppressed and eventually the accuracy of A-D conversion can be raised.

The output terminal of the reference voltage output circuit 24 is connected with the capacitor C and the control terminal of the transistor M via the correction switch SW-CAL. Thereby, when the correction switch SW-CAL is turned on, the voltage of the capacitor C coincides with the correction reference voltage Vcal which is an output of the reference output circuit 24. Accordingly, the disadvantage that the voltage held in the capacitor C in a conversion mode is inputted to the group of comparators 18 can be easily eliminated. That is, there will be no need of providing another means for resetting the voltage held in the capacitor C at the time of a conversion mode, so that the increase in circuit scale of the A-D converter 100 can be prevented.

In the correction mode, the first selection circuit 32 sequentially turns on and off the switches SW10 to SW15 by the shift resistors using flip-flops. Thereby, the offset of the first comparator CMP1 can be corrected by only implementing a simple configuration.

Second Embodiment

Figure 6:
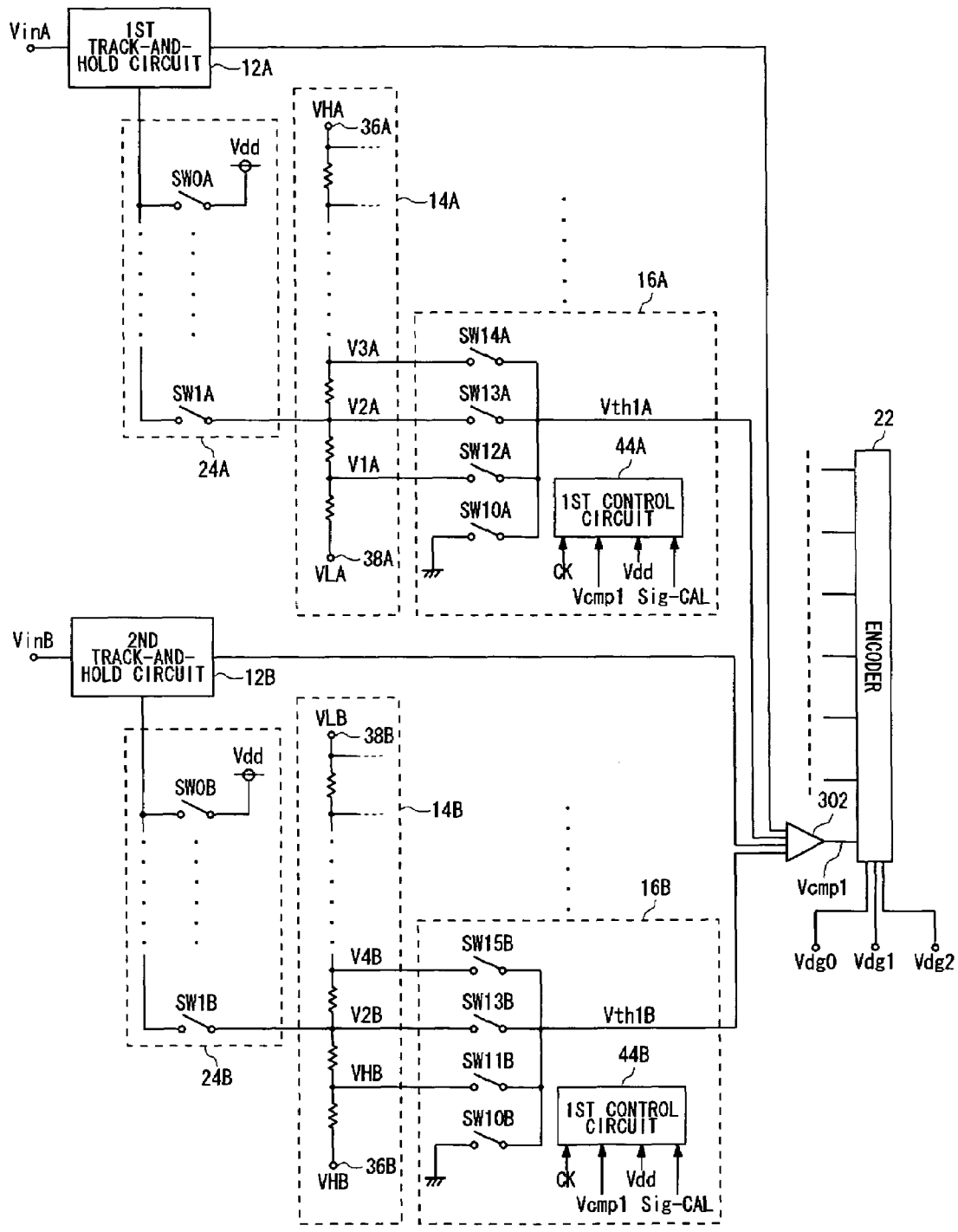
FIG. 6 is a circuit diagram showing a structure of an A-D converter according to a second embodiment of the present invention.

In a second embodiment, a description is given of a case where the analog signal is differentially inputted. FIG. 6 illustrates a structure of an A-D converter 300 according to the second embodiment. A positive-phase analog voltage VinA and a reverse-phase analog voltage VinB have 1.0 V as a common potential and are opposite in phase to each other.

A first track-and-hold circuit 12A and a second track-and-hold circuit 12B may be configured similarly to the track-and-hold circuit 12 shown in FIG. 1, and they operate the same way as the track-and-hold circuit 12 shown in FIG. 1. A first constant-voltage source 14A and a second constant-voltage source 14B may be configured similarly to the constant-voltage source 14 shown in FIG. 1, and the operation thereof is the same as that of the constant-voltage source 14 shown in FIG. 1. A first threshold voltage selection circuit 16A and a second threshold voltage selection circuit 16B may be configured similarly to the threshold voltage selection circuit 16 shown in FIG. 1, and it operates the same way as the threshold voltage selection circuit 16 shown in FIG. 1. A first reference voltage output circuit 24A and a second reference voltage output circuit 24B may be configured similarly to the reference voltage output circuit 24 shown in FIG. 1, and it operates the same way as the reference voltage output circuit 24 shown in FIG. 1.

The conversion mode will now be described centering around different points from the first embodiment.

A first comparator circuit 302 receives, as input, a positive-phase analog voltage VinA, a first positive-phase-side threshold voltage Vth1A, a reverse-phase analog voltage VinB and a first reverse-phase-side threshold voltage Vth1B. When these four outputs satisfy the following relation, the first comparator circuit 302 outputs a first comparison output Vcmp1 of high level.

$(VinA-Vth1A)+(Vth1B-VinB)>0$

When, on the other hand, the aforementioned four outputs hold the following relation $(VinA-Vth1A)+(Vth1B-VinB)<0,$ the first comparator circuit 302 outputs a first comparison output Vcmp1 of low level. The same applies to a second comparator circuit to a seventh comparator circuit which are not shown in FIG. 6.

The correction mode will now be described centering around different points from the first embodiment.

When the offset of the first comparator circuit 302 is to be corrected, the first comparison output Vcmp1, which is an output of the first output comparator circuit 302, is first reset to a high level the same way as in the first embodiment. The second threshold voltage selection circuit 16B sequentially turns on switches SW11B, SW13B and SW15B. The switch which has been turned on when the first comparison output Vcmp1 transited from the high level to a low level is set as a switch which will be turned on at the next conversion mode. In the first embodiment, the threshold voltage selection circuit 16 sequentially turns on the switches SW11, SW12, SW13, SW14 and SW15. In contrast thereto, in the second embodiment the second threshold voltage selection circuit 16B sequentially turns on the switches SW11B, SW13B and SW15B only. Accordingly, the correction operation by the second threshold voltage selection circuit 16B is faster but coarser than the correction operation by the threshold voltage selection circuit 16 in the first embodiment.

As the correction operation by the second threshold voltage selection circuit 16B ends, the first comparison output Vcmp1 is reset again to a high level. The first threshold voltage selection circuit 16A sequentially turns on the switches SW12A, SW13A and SW14A. The switch which has been turned on when the first comparison output Vcmp1 transited from the high level to a low level is set as a switch which will be turned on at the next conversion mode. As was described in the above first embodiment, the threshold voltage selection circuit 16 sequentially turns on the switches SW11, SW12, SW13, SW14 and SW15. In contrast thereto, in the second embodiment the first threshold voltage selection circuit 16A sequentially turns on the switches SW12A, SW13A and SW14A. Accordingly, in the correction operation by the first threshold voltage selection circuit 16A, the range of the magnitude of a constant voltage to be inputted is narrower as compared with the correction operation by the threshold voltage selection circuit 16 in the first embodiment. However, the offset of the first comparator circuit 302 has already been corrected coarsely by the second threshold voltage selection circuit 16B. Hence, even if the range of the constant voltage inputted to the first comparator circuit 302 is narrower, the offset of the first comparator circuit 302 can be appropriately corrected. Note that the offsets of the second comparator circuit to the seventh comparator circuit which are omitted in FIG. 6 are also corrected in a similar manner.

The A-D converter 300 according to the second embodiment of the present invention also achieves the same operation and advantageous effects as the A-D converter 100 according to first embodiment. Furthermore, according to the second embodiment, the offset of the first comparator circuit 302 is coarsely corrected by the second threshold voltage selection circuit 16B before it is corrected more finely by the first threshold voltage selection circuit 16A. Thereby, the correction of the offset of the first comparator circuit 302 can be accurately done in a short period of time. Also, since the input of analog voltage is inputted in a differential manner, the A-D converter 300 is robust against the common mode noise.

The embodiments described above are merely exemplary, and it is understood by those skilled in the art that various modifications to the combination of each component and process thereof are possible and such modifications are also within the scope of the present invention.

In the correction mode of the A-D converter 100 according to the first embodiment, the outputs of the first comparator CMP1 to the seventh comparator CMP7 are set to the high level but they may be reset to the low level. Also, in the first control circuit 42 the switches SW10, SW11, SW12, SW13, SW14 and SW15 are sequentially turned on but the order in which the switches are turned on is not limited thereto. The switches may be sequentially turned on in the order starting from the switch SW15 to the switch SW11. In such a case, the degree of freedom in designing the A-D convert 100 increases. In the first embodiment, the voltage, in which the high voltage VH and the low voltage VL are voltage-divided by the resistors R1 to the sixteenth resistor 16, is used as the correction reference voltage Vcal, but the correction reference voltage Vcal may be generated by a circuit other than the constant-voltage source 14. In such a case, the degree of freedom in designing the A-D convert 100 increases. In the first embodiment, the analog voltage Vin is converted to a 3-bit digital value, but this should not be considered as limiting. To which number of bits in the digital value the analog voltage Vin shall be converted is determined, as appropriate, by the degree of accuracy required. In the first embodiment, a description was given using an example of the A-D converter 100 of a parallel-comparison type, but the A-D converter 100 may be applied to a pipeline type A-D converter on which a parallel type A-D converter is mounted. In such a case, the applicable range of the A-D converter will be broader.

In the second embodiment, both the first threshold voltage selection circuit 16A and the second threshold voltage selection voltage 16B perform the operation of correcting the offsets. However, the operation of correcting the offsets may be performed by one of the first threshold voltage selection circuit 16A and the second threshold voltage selection voltage 16B. In the second embodiment, the offsets of the comparator circuits are coarsely corrected by the second threshold voltage selection circuit 16B and, thereafter, the offsets of the comparator circuits are finely corrected by the first threshold voltage selection circuit 16A. However, this should not be considered as limiting, and the offsets of the comparator circuits may be finely corrected by the second threshold voltage selection circuit 16B after the offsets of the comparator circuits have been coarsely corrected by the first threshold voltage selection circuit 16A. In this case, the degree of freedom in designing the A-D convert 300 increases.

In each embodiment above, the analog voltage Vin and the correction reference voltage Vcal are inputted to the first comparator CMP1 to the seventh comparator CMP7 using the same current source, namely the constant current source 26. In a modification to the embodiments, they may be inputted using separate current sources and the input voltage may be switched by turning on and off the current sources at the conversion mode and the correction mode. In this case, too, the mode switching can be achieved without provision of switches in an input path, so that the satisfactory frequency characteristics can be maintained.

While the preferred embodiments of the present invention have been described using specific terms, such description is for illustrative purposes only, and it is to be understood that changes and variations may be made without departing from the spirit or scope of the appended claims.

What is claimed:

1. An analog-to-digital (A-D) converter, which converts an analog signal to a digital signal, the A-D converter comprising:

a plurality of comparator circuits which compare an input analog voltage with a plurality of different threshold values;

a threshold voltage selection circuit which selects voltages inputted to said plurality of comparator circuits, as the plurality of different threshold values;

a reference voltage output circuit which outputs a correction reference analog voltage which is to be inputted to said plurality of comparator circuits when the selection of voltage by said threshold voltage circuit is to be corrected; and a track-and-hold circuit which holds temporarily the input analog voltage and inputs it to said plurality of comparator circuits, wherein the track-and-hold circuit includes:

a first switch which switches between the input and shutoff of the input analog voltage;

a second switch which switches between the input and shutoff of the correction reference analog voltage;

a capacitor connected between a path connecting the first switch and the second switch to the plurality of comparator circuits, and a predetermined fixed potential.

2. An analog-to-digital converter according to claim 1, wherein during a period of time in which the input analog voltage is temporarily held, said track-and-hold circuit shuts off the input of the input analog voltage to said plurality of comparator circuits all at once.

3. An analog-to-digital converter according to claim 1, wherein said track-and-hold circuit delivers the input analog voltage to said plurality of comparators, respectively, without the medium of respective switches.

4. An analog-to-digital converter according to claim 1, further comprising a constant-voltage source which outputs a plurality of constant voltages having different values to be selected in said threshold voltage selection circuit, wherein said threshold voltage selection circuit includes a group of switches that sequentially switch the selection in the ascending or descending order among the plurality of constant voltages for at least one of said plurality of comparator circuits, when the correction reference analog voltage is inputted to said plurality of comparator circuits.

5. An analog-to-digital converter according to claim 4, wherein said threshold voltage selection circuit includes shift registers which operate the group of switches so that a voltage is selected, as the threshold value, in the ascending or descending order among the plurality of constant voltages having different values.

6. The analog-to-digital (A-D) converter according to claim 1, wherein the track-and-hold circuit further includes a source follower which receives a voltage occurring at the capacitor terminal connected to the path and which outputs the temporarily held input analog voltage to the plurality of comparator circuits.

* * * * *